(12) United States Patent
Winters

(10) Patent No.: US 6,961,032 B2
(45) Date of Patent: Nov. 1, 2005

(54) REDUCING THE EFFECTS OF SHORTS IN PIXELS OF AN ACTIVE MATRIX ORGANIC ELECTROLUMINESCENT DEVICE

(75) Inventor: Dustin Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 230 days.

(21) Appl. No.: 10/430,759

(22) Filed: May 6, 2003

(65) Prior Publication Data

US 2004/0222746 A1    Nov. 11, 2004

(51) Int. Cl.[7] .............................................. G09G 3/30
(52) U.S. Cl. ........................................ 345/76; 345/904
(58) Field of Search .......................... 315/169.1, 169.3;
345/76, 77, 87, 90, 91, 92, 98, 102, 103,
345/204, 904; 348/800; 349/43, 55; 313/169.1–169.3

(56) References Cited

U.S. PATENT DOCUMENTS

| | | | | |
|---|---|---|---|---|
| 5,550,066 A | | 8/1996 | Tang et al. ..................... 428/29 |
| 5,640,067 A | * | 6/1997 | Yamauchi et al. ........... 313/504 |
| 5,897,328 A | * | 4/1999 | Yamauchi et al. ............. 438/29 |
| 6,281,634 B1 | | 8/2001 | Yokoyama ................ 315/169.3 |
| 6,456,013 B1 | | 9/2002 | Komiya et al. ........... 315/169.1 |
| 6,501,466 B1 | * | 12/2002 | Yamagishi et al. .......... 345/204 |
| 6,757,033 B2 | * | 6/2004 | Song et al. ..................... 349/48 |
| 6,853,083 B1 | * | 2/2005 | Yamauchi et al. ........... 257/763 |
| 2002/0080295 A1 | * | 6/2002 | Someya et al. ................ 349/43 |
| 2002/0154079 A1 | * | 10/2002 | Shiota et al. ................... 345/87 |
| 2003/0213955 A1 | * | 11/2003 | Noguchi et al. ............... 257/59 |
| 2003/0231152 A1 | * | 12/2003 | Shin ............................... 345/83 |
| 2004/0160167 A1 | * | 8/2004 | Arai et al. .................... 313/500 |
| 2004/0179147 A1 | * | 9/2004 | Kiya et al. ..................... 349/55 |
| 2004/0233140 A1 | | 11/2004 | Jo ................................. 345/76 |
| 2005/0007318 A1 | * | 1/2005 | Kasai et al. ................... 345/76 |

FOREIGN PATENT DOCUMENTS

EP                1 102 317 A2      5/2001

* cited by examiner

Primary Examiner—Bipin Shalwala
Assistant Examiner—Nitin Patel
(74) Attorney, Agent, or Firm—Raymond L. Owens

(57) ABSTRACT

An OLED device, with each pixel including a plurality of laterally spaced first electrodes, each corresponding to a portion of the pixel and a common second electrode vertically spaced from the plurality of first electrodes; at least one light-emitting layer disposed between the first and second electrodes including a host and a dopant for emitting light in response to current; a hole-transporting layer disposed between the light-emitting layer and the first or second electrodes; and a transistor drive circuit for each pixel including separate transistors, each transistor associated with a different one of the first electrodes and when driven causes current to pass between its corresponding first electrode and the second electrode so that, if there is a short in the portion between an individual first electrode and the second electrode, the remaining portions will continue to produce light in the light-emitting layer, thereby reducing the effects of the short.

12 Claims, 4 Drawing Sheets

REDUCING THE EFFECTS OF SHORTS IN PIXELS OF AN ACTIVE MATRIX ORGANIC ELECTROLUMINESCENT DEVICE

FIELD OF THE INVENTION

The present invention relates to organic electroluminescent (EL) devices, which reduce the effects of shorts in pixels.

BACKGROUND OF THE INVENTION

Organic EL displays are typically driven by active matrix circuitry in order to produce high performance devices. In an active matrix configuration, each pixel is driven by multiple circuit elements such as two or more transistors, one or more capacitors, and signal lines. For multicolor devices, a pixel is divided into subpixels each with a complete set of circuit elements. For a RGB (red, green, blue) device, each pixel consists of three subpixels, which emit red, green, and blue light. Examples of such active matrix organic EL devices are provided in U.S. Pat. Nos. 5,550,066; 6,281,634; and 6,456,013; and EP 1102317.

When manufacturing organic EL displays, problems such a particle contamination or scratches in the organic EL materials from the various process steps such as shadow masking may result in defects in a display. One type of defect that is caused by particle contamination or scratches is a short circuit through the thin organic materials, connecting the anode and the cathode. A short between the anode and cathode results in a non-emitting pixel.

Many defects, such as particle contamination and scratches, typically occur with an area density that depends on the capability of the manufacturing process and equipment. However, the total yield with respect to non-emitting pixels depends on the area density of the defects and the area of the individual displays. Larger displays such as those useful for televisions, computer monitors, or laptops, will have lower yields than smaller substrates given the same defect density.

SUMMARY OF THE INVENTION

It is therefore an object of the present invention to produce an active matrix organic EL device that is less sensitive to anode to cathode short circuit defects caused by the manufacturing process.

This object is achieved by an OLED device having a plurality of pixels, with each pixel comprising:
  a) a plurality of laterally spaced first electrodes, each corresponding to a portion of the pixel and a common second electrode vertically spaced from the plurality of first electrodes;
  b) at least one light-emitting layer disposed between the first and second electrodes including a host and a dopant for emitting light in response to current;
  c) a hole-transporting layer disposed between the light-emitting layer and the first or second electrodes; and
  d) a transistor drive circuit for each pixel including separate transistors, each transistor associated with a different one of the first electrodes and when driven causes current to pass between its corresponding first electrode and the second electrode so that, if there is a short in the portion between an individual first electrode and the second electrode, the remaining portions will continue to produce light in the light-emitting layer, thereby reducing the effects of the short.

ADVANTAGES

It has been determined that, while no non-emitting pixels are desired, some amount of non-emitting area may be acceptable, depending on the quality requirements of the display application. Furthermore, partially emitting pixels (that is partially dark or relatively dim) can be more acceptable than totally non-emitting pixels.

An OLED device, in accordance with the invention, will have a higher manufacturing yield and therefore lower cost. Such a device reduces the effects of shorts by producing two or more emitting elements per pixel with separated lower electrodes and which, along with separate drive transistors, are connected in parallel to each other.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a display device comprising organic light-emitting diodes as pixels and will also be referred to as an organic light-emitting device. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of producing light in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. For the purpose of this invention, no distinction is made between pixels and multicolor subpixels. For example, in an RGB device, the red element is defined here as a pixel, the blue element is defined as another pixel, and the green element is defined as a third pixel.

Figure 1:
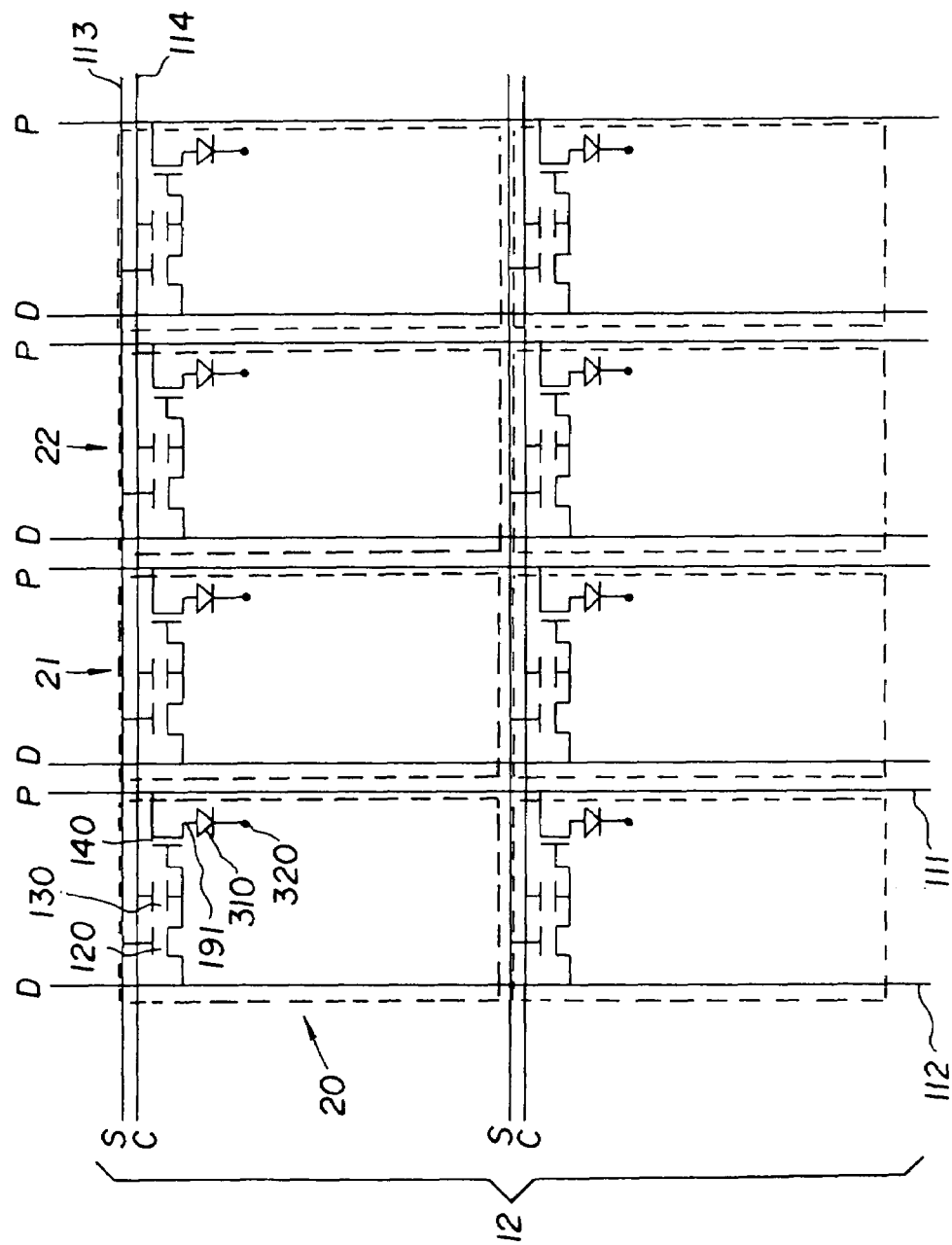
FIG. 1 shows a circuit pattern diagram of an OLED device active matrix circuit according to the prior art.

Turning now to FIG. 1, there is shown a circuit pattern diagram of an OLED device 12 active matrix circuit used to drive an OLED display according to the prior art. This circuit includes a select line 113, which is used to select a row of pixels including 20. One row is addressed at any given time by applying voltage to that row's select line 113.

All rows are scanned once per frame. Data lines 112 run perpendicular to the select line 113 and are used to determine the brightness of each pixel 20 in the row. The gate of a select transistor 120 is connected to the select line 113 and a second terminal is connected to the data line 112. The third terminal of the select transistor 120 is connected to the gate of the power transistor 140 as well as to one side of storage capacitor 130. Storage capacitor 130 then holds the data line voltage while the select line 113 is not selected until the row is again selected in the next frame. The second side of the storage capacitor 130 is connected to capacitor line 114 with all capacitors connected together. The other terminals of the power transistor 140 are connected on one side to a power line 111 and on the other side to the first electrode 191 of the organic EL element 310. The second electrode 320 of the organic EL element is common to all pixels. Organic EL layers 310 are represented by a diode symbol in FIG. 1.

While OLED device 12 is shown as a monochrome device, it can also represent a multicolor or full color OLED display in which a plurality of devices produces different colors. For example, pixels 20, 21, and 22 can represent red-emitting, green-emitting, and blue-emitting pixels, respectively, in a repeating pattern across the surface of OLED display 12.

Figure 2:
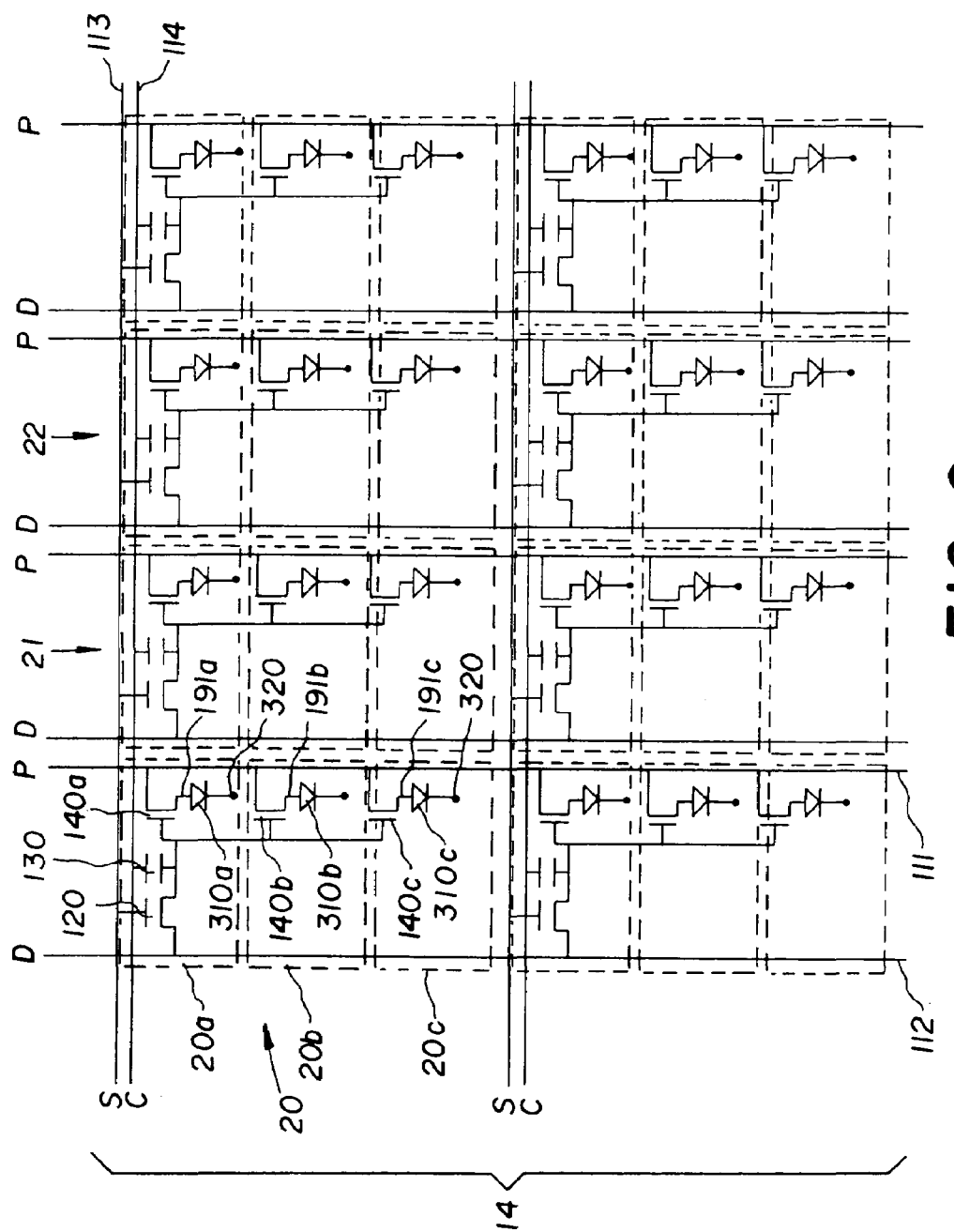
FIG. 2 shows a circuit pattern diagram of an OLED device active matrix circuit according to a first embodiment of the present invention.

FIG. 2 shows a circuit pattern diagram of an OLED device 14 active matrix circuit used to drive an OLED display according to a first embodiment of the present invention. In the present invention, power lines 111, data lines 112, select lines 113, and capacitor lines 114 are all present and serve the same function as in the prior art. Furthermore, a select transistor 120 connected to select line 113 and data line 112, as well as a storage capacitor 130, are also present and serve the same function as in the prior art. However, in the current invention, the single power transistor 140 of the prior art is replaced by two or more separate power transistors (shown in this embodiment as first, second, and third power transistors 140a, 140b, and 140c, respectively) which are connected in parallel by a single common gate connection to be simultaneously driven. The common gate connection is also connected to the storage capacitor 130 and to one terminal of the select transistor 120 to indicate the amount of current to be driven through each portion 20a, 20b, and 20c of pixel 20. Each of the power transistors is also connected to independent portions of pixels 20 (shown as pixel portions 20a, 20b, and 20c). The multiple portions of pixel 20 each have a separate laterally spaced first electrode 191a, 191b, or 191c each corresponding to a portion (20a, 20b, or 20c, respectively) of pixel 20, and each associated with its corresponding power transistor 140a, 140b, or 140c. Organic EL layers are formed over the first electrodes creating an individual emitting element for each of the first electrodes. The emitting elements are shown in this embodiment as organic light emitting diode 310a connected to first electrode 191a, organic light emitting diode 310b connected to first electrode 191b, and organic light emitting diode 310c connected to first electrode 191c. Therefore, independent current paths are formed from the power line 111 to the common second electrode 320, which is vertically spaced from the plurality of first electrodes 191a, 191b, and 191c. Through arrangement of this circuit, current simultaneously passes between the first electrodes 191a, 191b, and 191c and the second electrode 320 so that a short circuit between the a first electrode and the second electrode in any one of the pixel portions 20a, 20b, and 20c caused by a manufacturing defect in the area of the pixel 20 will cause only that portion of the pixel 20 to be non-emissive. However, the remaining portions of the pixel 20 which are not in the area of the defect will continue to produce light, causing pixel 20 to be partially emissive instead of completely non-emissive, thereby reducing the effects of the short.

While OLED device 14 is shown as a monochrome device, it can also represent a multicolor or full color OLED display in which a plurality of devices produces different colors. For example, pixels 20, 21, and 22 can represent red-emitting, green-emitting, and blue-emitting pixels, respectively, in a repeating pattern across the surface of OLED display 14.

Figure 3:
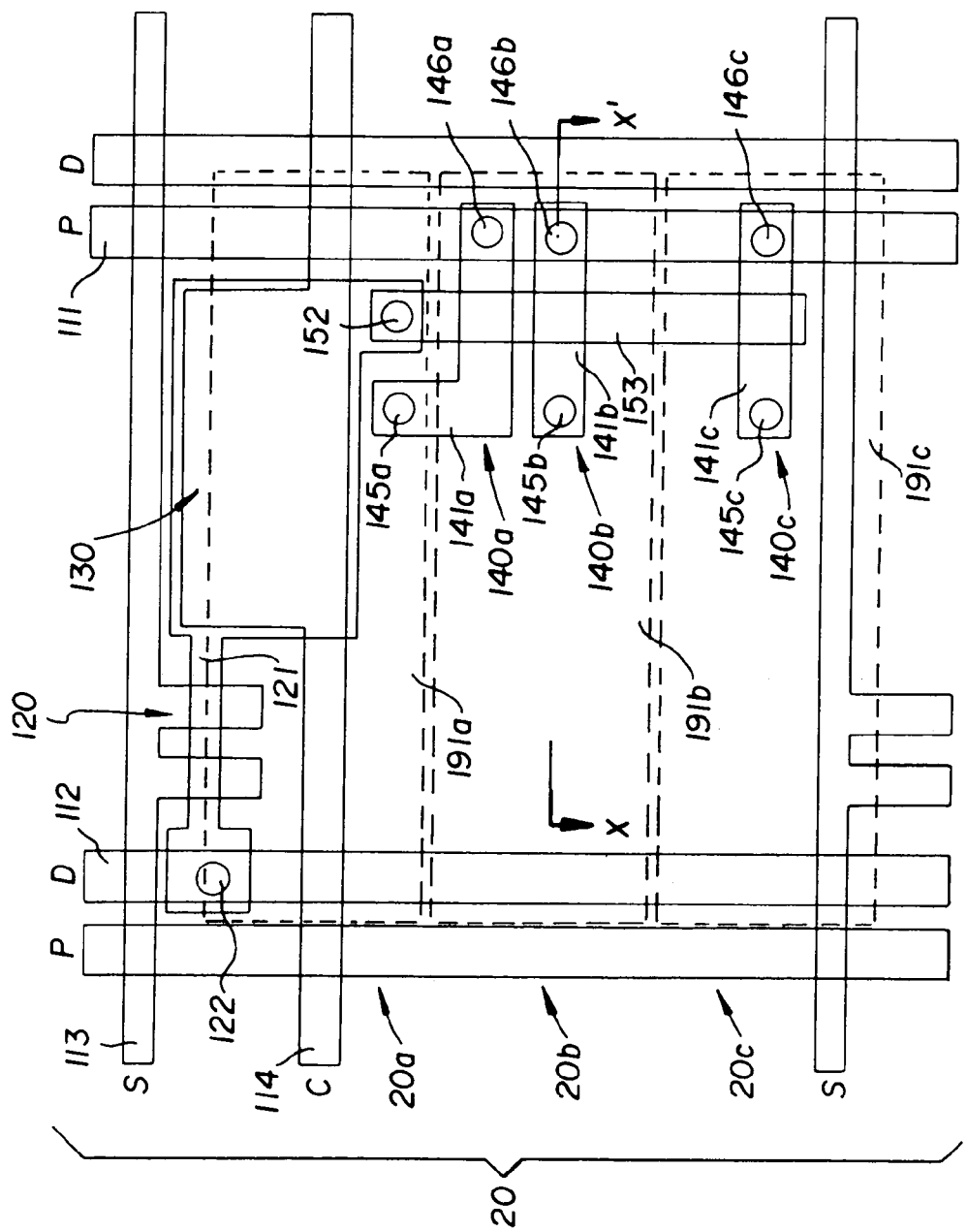
FIG. 3 shows a layout pattern diagram of an OLED device active matrix circuit according to a first embodiment of the present invention.

FIG. 3 shows a layout pattern diagram of an OLED device pixel 20 for the above first embodiment of the invention. The drive circuitry components are fabricated using conventional integrated circuit technologies. For each pixel 20, the select transistor 120 is formed from a first semiconductor region 121 using techniques well known in the art. Similarly, the multiple power transistors 140a, 140b, and 140c can be formed in semiconductor regions 141a, 141b, and 141c. The first and second semiconductor regions are typically formed in the same semiconductor layer. This semiconductor layer is typically silicon which can be amorphous, polycrystalline, or crystalline. This first semiconductor region 121 also forms one side of the storage capacitor 130. Over the first and second semiconductor regions is an insulating layer (not shown) that forms the gate insulator of the select transistor 120, the gate insulator for power transistors 140a, 140b, and 140c, and the insulating layer of the storage capacitor 130. The gate of the select transistor 120 is formed from part of the select line 113, which is formed in the first conductor layer. The power transistors 140a, 140b, and 140c have a common gate connection 153, also preferably formed in the first conductor layer, and are all connected to power line 111 through respective vias 146a, 146b, and 146c. The power transistor's 140a, 140b, and 140c are also connected to the organic EL elements' first electrodes 191a, 191b, and 191c by vias 145a, 145b, and 145c, respectively. The other electrode of the storage capacitor 130 is formed as part of capacitor line 114, also preferably formed from the first conductive layer. The power lines 111 and the data lines 112 are preferably formed in a second conductive layer. One or more of the signal lines (e.g. select line 113) frequently cross at least one or more of the other signal lines (e.g. data line 112), which requires these lines to be fabricated from multiple conductive layers with at least one interlayer insulating layer (not shown). The pixel 20 is formed by patterning first electrodes 191a, 191b, and 191c for each pixel as well as depositing one or more layers of organic EL media (not shown) and a second electrode (not shown).

Connections between layers are formed by etching holes (or vias) in the insulating layers such as vias 145a, 145b, 145c, 146a, 146b, and 146c described above. Other vias include via 152 connecting the power transistor gate conductor 153 to first semiconductor region 121 of the storage capacitor 130, and via 122 connecting data line 112 to the first semiconductor region 121 of the select transistor 120.

Figure 4:
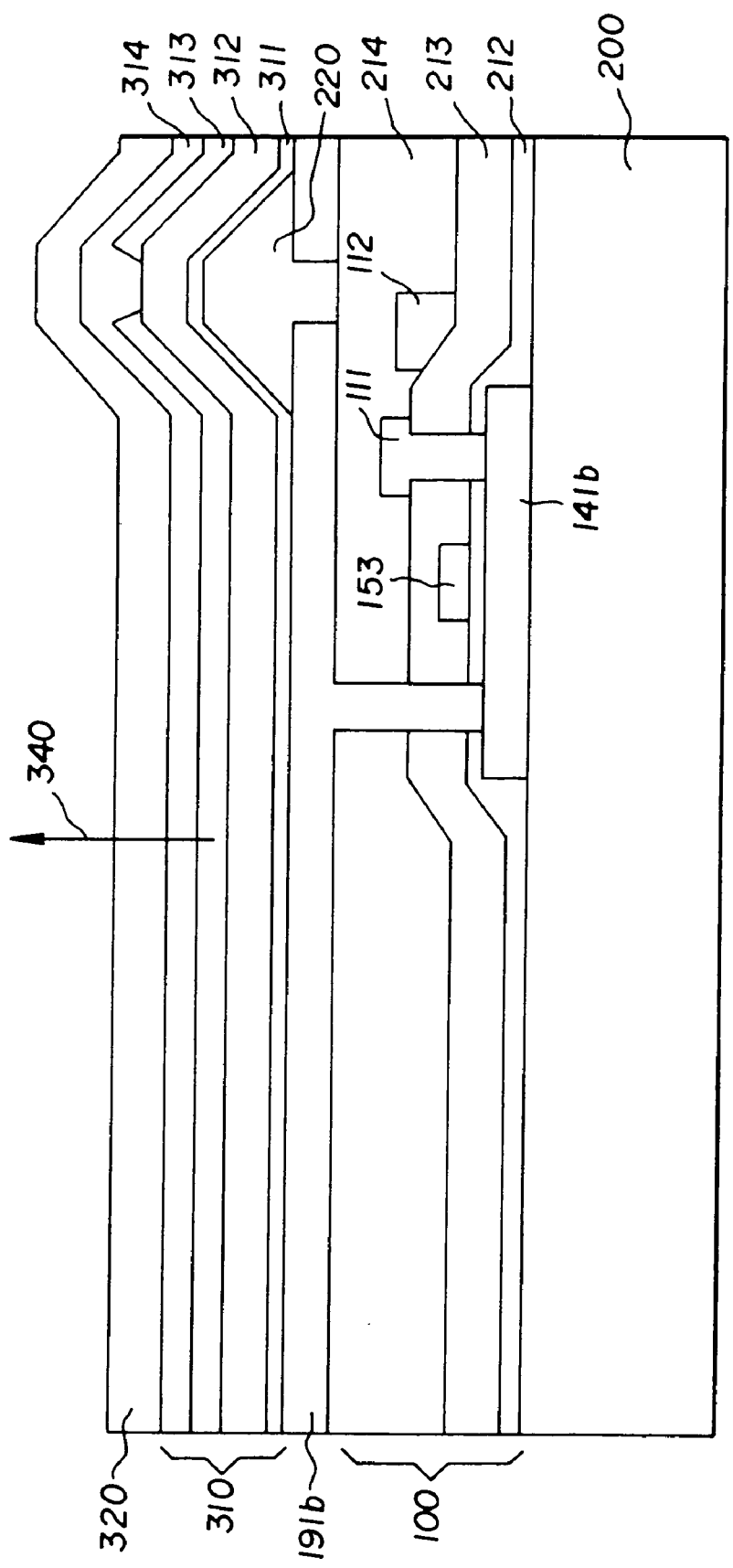
FIG. 4 shows a cross-sectional view of an OLED device according to the present invention.

FIG. 4 shows a cross section of pixel 20 of the device along line X–X' as shown in FIG. 3. The OLED device of this invention and the subpixels therein are typically disposed as shown over a supporting substrate 200. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials.

FIG. 4 shows the vertical arrangement of the various layers and the vertically spaced first and second electrodes 191b and 320, respectively, included in each portion (e.g. 20b) of a pixel (e.g. 20). The transistor drive circuit 100 is disposed over substrate 200 and under organic EL layers 310 in a manner herein described. Over the substrate 200, a semiconductor layer is formed, doped, and patterned into regions including semiconductor region 141b. A gate insulating layer 212 is formed over the semiconductor layer. Over the gate insulating layer 212, a gate conductor 153 is formed from a first conductor layer. Semiconductor region 141b is then doped to form source and drain regions on either sides of the gate conductor 153 by well known methods. A first interlayer insulator layer 213 is formed over the gate conductor 153. Over the first interlayer insulator layer 213, a second conductor layer is deposited and patterned forming the power lines 111 and the data lines 112. A second interlayer insulator layer 214 is formed over the power and data lines. The first electrode 191b of pixel 20b is formed over the second interlayer insulator layer 214. The first electrodes, such as 191b, are patterned to form multiple organic EL elements per pixel. That is, the first electrodes are patterned so as to be isolated from the other first electrodes of the other portions (e.g. 20a, 20c) of that pixel as well as isolated from the first electrodes of neighboring pixels (e.g. 21). Around the edges of the first electrode 191b, an electrode insulating film 220 is formed to reduce shorts between the first electrode 191b and the second electrode 320. Use of such electrode insulating films over the first electrode 191b is disclosed in U.S. Pat. No. 6,246,179. While use of the electrode insulating film 220 can have beneficial effects, it is not required for successful implementation of the invention.

The electrode nearest the substrate is conveniently referred to as the bottom electrode or first electrode 191b. When EL emission is viewed through the first electrode 191b, the first electrode should be transparent or substantially transparent to the emission of interest. Common transparent first electrode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the first electrode 191b. For applications where EL emission is viewed only through the second electrode 320, the first electrode 191b is reflective and example conductors for this application include, but are not limited to, gold, silver, iridium, molybdenum, palladium, and platinum. The first electrode 191b is typically biased as the anode, but this invention is not limited to that configuration. Typical anode materials, transmissive or otherwise, have a work function of 4.1 eV or greater. Desired first electrode materials are commonly deposited by any suitable means such as evaporation, sputtering, chemical vapor deposition, or electrochemical means. First electrode 191b can be patterned using well known photolithographic processes. Optionally, first electrode 191b can be polished prior to application of other layers to reduce surface roughness so as to reduce shorts or enhance reflectivity. While the first electrode 191b is shown as one layer, multiple layers of differing materials can be used to achieve the desired electrical and optical properties.

Organic EL media 310 are disposed between the first and second electrodes, 191b and 320, respectively, of each pixel portion. There are numerous organic EL layer structures known in the art wherein the present invention can be employed. For example, organic EL media 310 can include e.g. light-emitting layer 313 disposed between first electrode 191b and second electrode 320, hole-transporting layer 312 disposed between light-emitting layer 313 and the electrode that is configured as an anode, hole-injecting layer 311 disposed between the hole-transporting layer 312 and the anode, and electron-transporting layer 314 disposed between light-emitting layer 313 and the electrode configured as a cathode.

While not always necessary, it is often useful to provide a hole-injecting layer 311 between first electrode 191b and hole-transporting layer 312. The hole-injecting layer 311 can serve to improve the film formation property of subsequent organic layers and to facilitate injection of holes into the hole-transporting layer 312. Suitable materials for use in the hole-injecting layer 311 include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, and some aromatic amines, for example, m-MTDATA (4,4',4"-tris[(3-methylphenyl)phenylamino]triphenylamine). Alternative hole-injecting materials for organic EL devices are described in EP 0 891 121 A1 and EP 1 029 909 A1.

The hole-transporting layer 312 is disposed in this invention between light-emitting layer 313 and the electrode that is configured as the anode, and contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer 312 can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl 4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 313 of pixel portion 20b includes a luminescent or fluorescent material where electroluminescence is produced as a result of electron-hole pair recombination in this region, emitting light 340 in response to current. In the case of a full color or multicolor OLED display, light-emitting layer 313 emits a particular colored light so that various devices within the OLED display produce different colors. Light 340 is shown for a top-emitting device, wherein light 340 passes through second electrode 320 to be viewed by a user, but it will be understood that pixel portion 20b can be a bottom-emitting device in other embodiments. As is shown in FIG. 4, light-emitting layer 313 is the only layer that requires patterning between pixels of different color according to the technique taught in U.S. Pat. No. 6,281,634. However, it is not necessary to pattern light-emitting layer 313 between the portions within a pixel. The light-emitting layer 313 can be comprised of a single material, but more commonly consists of a host material doped with a guest compound or compounds where light emission comes primarily from the dopant and can be of any color. The host materials in the light-emitting layer 313 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium(III)]
CO-9: Zirconium oxine [alias, tetra(8-quinolinolato)zirconium(IV)].

Other classes of useful host materials include, but are not limited to derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2', 2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Preferred thin film-forming materials for use in forming the electron-transporting layer 314 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Disposed over the organic EL layers is the second electrode 320. The second electrode is common to all pixels and does not require precision alignment and patterning. The second electrode 320 is typically biased as the cathode.

When light emission is viewed solely through substrate 200, the second electrode 320 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injecting layer (EIL) in contact with the organic layer (e.g., electron-transporting layer 314) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the second electrode 320, the second electrode 320 must be transparent or nearly transparent. For such applications, metals must be thin or one must use transparent conductive oxides, or a combination of these materials. Optically transparent cathodes have been described in more detail in U.S. Pat. Nos. 4,885,211 and 5,247,190; JP 3,234,963; U.S. Pat. Nos. 5,703,436; 5,608,287; 5,837,391; 5,677,572; 5,776,622; 5,776,623; 5,714,838; 5,969,474; 5,739,545; 5,981,306; 6,137,223; 6,140,763; and 6,172,459; EP 1 076 368; U.S. Pat. Nos. 6,278,236 and 6,284,393. Materials for second electrode 320 are typically deposited by evaporation, sputtering, or chemical vapor deposition. While one layer is shown for the second electrode, multiple sublayers can be combined to achieve the desired level of conductance and transparency such as an ITO layer and an Al layer.

In some instances, light-emitting layer 313 and electron-transporting layer 314 can optionally be replaced by a single layer that serves the function of supporting both light emission and electron transportation. It is also known in the art that emitting dopants can be added to the hole-transporting layer 312, which can serve as a host.

Additional layers such as electron- or hole-blocking layers as taught in the art can be employed in devices of this invention. Hole-blocking layers are commonly used to improve efficiency of phosphorescent emitter devices, for example, as in U.S. Patent Application Publication 2002/0015859 A1.

The organic materials above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be premixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well known optical effects in order to enhance its properties if desired. This includes but is not limited to optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display.

The invention has been described in detail with particular reference to certain preferred embodiments thereof, but it will be understood that variations and modifications can be effected within the spirit and scope of the invention.

PARTS LIST

12 OLED device or OLED display
14 OLED device or OLED display
20 pixel
20a pixel portion
20b pixel portion
20c pixel portion
21 pixel
22 pixel
100 transistor drive circuit
111 power line
112 data line
113 select line
114 capacitor line
120 select transistor
121 semiconductor region
122 via
130 storage capacitor
140 power transistor
140a power transistor
140b power transistor
140c power transistor
141a semiconductor region
141b semiconductor region
141c semiconductor region
145a via
145b via
145c via
146a via
146b via
146c via
152 via
153 gate conductor
191 first electrode
191a first electrode
191b first electrode
191c first electrode
200 substrate
212 gate insulating layer
213 insulator layer 214 insulator layer
220 insulating film
310 organic EL layers
310a organic light emitting diode
310b organic light emitting diode
310c organic light emitting diode
311 hole-injecting layer
312 hole-transporting layer
313 light-emitting layer
314 electron-transporting layer
320 second electrode
340 light

What is claimed is:

1. An OLED device having a plurality of pixels, with each pixel comprising:
   a) a plurality of laterally spaced first electrodes, each corresponding to a portion of the pixel and a common second electrode vertically spaced from the plurality of first electrodes;
   b) at least one light-emitting layer disposed between the first and second electrodes including a host and a dopant for emitting light in response to current;
   c) a hole-transporting layer disposed between the light-emitting layer and the first or second electrodes; and
   d) a transistor drive circuit for each pixel including separate transistors, each transistor associated with a different one of the first electrodes and when driven causes current to pass between its corresponding first electrode and the second electrode so that, if there is a short in the portion between an individual first electrode and the second electrode, the remaining portions will continue to produce light in the light-emitting layer, thereby reducing the effects of the short.

2. The device of claim 1 wherein the first electrodes are anodes, and the second electrode is a cathode.

3. The device of claim 2 further including an electron-transporting layer disposed between the cathode and the light-emitting layer.

4. The device of claim 1 wherein light, which is viewed by a user, passes through the second electrode.

5. The device of claim 1 wherein the transistors are power transistors that are connected in parallel and further including a select transistor connected to the gate of each power transistor to pass a data signal to indicate the amount of current to be driven through each portion of the pixel.

6. The device of claim 1 wherein the transistors are power transistors that are connected in parallel and further including a storage capacitor connected the gate of the power transistors to hold and a select transistor connected to the gate of each power transistor to pass a data signal to be held by the storage capacitor which indicates the amount of current to be driven through each portion of the pixel.

7. An OLED device which produces different colors and wherein the OLED device has a plurality of pixels with each pixel comprising:
   a) a plurality of laterally spaced first electrodes, each corresponding to a portion of the pixel and a common second electrode vertically spaced from the plurality of first electrodes;
   b) at least one light-emitting layer disposed between the first and second electrodes including a host and a dopant for emitting a particular colored light in response to current;
   c) a hole-transporting layer disposed between the light-emitting layer and the first or second electrodes; and
   d) a transistor drive circuit for each pixel including separate transistors, each transistor associated with a different one of the first electrodes and when driven causes current to pass between its corresponding first electrode and the second electrode so that, if there is a short in the portion between an individual first electrode and the second electrode, the remaining portions will continue to produce light in the light-emitting layer, thereby reducing the effects of the short.

8. The device of claim 7 wherein the first electrodes are anodes, and the second electrode is a cathode.

9. The device of claim 8 further including an electron-transporting layer disposed between the cathode and the light-emitting layer.

10. The device of claim 7 wherein light, which is viewed by a user, passes through the second electrode.

11. The device of claim 7 wherein the transistors are power transistors that are connected in parallel and further including a select transistor connected to the gate of each power transistor to pass a data signal to indicate the amount of current to be driven through each portion of the pixel.

12. The device of claim 7 wherein the transistors are power transistors that are connected in parallel and further including a storage capacitor connected the gate of the power transistors to hold and a select transistor connected to the gate of each power transistor to pass a data signal to be held by the storage capacitor which indicates the amount of current to be driven through each portion of the pixel.

* * * * *